United States Patent
Chida et al.

(10) Patent No.: US 7,885,723 B2
(45) Date of Patent: Feb. 8, 2011

(54) SETTING DEVICE, COMPONENT MOUNTING SYSTEM, PROGRAM AND CALCULATING METHOD

(75) Inventors: Takafumi Chida, Yokohama (JP); Attila Lengyel, Yokohama (JP); Ken Igarashi, Yokohama (JP); Haruhiko Yamaguchi, Ota (JP); Manabu Okamoto, Isesaki (JP); Koichi Izuhara, Oizumi (JP)

(73) Assignee: Hitachi High-Tech Instruments Co., Ltd., Tokyo (JP)

( * ) Notice: Subject to any disclaimer, the term of this patent is extended or adjusted under 35 U.S.C. 154(b) by 196 days.

(21) Appl. No.: 11/773,836

(22) Filed: Jul. 5, 2007

(65) Prior Publication Data

US 2008/0005892 A1   Jan. 10, 2008

(30) Foreign Application Priority Data

Jul. 7, 2006   (JP) ............................. 2006-187533

(51) Int. Cl.
*G06F 19/00* (2006.01)
*G05B 13/02* (2006.01)
*H05K 3/30* (2006.01)

(52) U.S. Cl. ..................... 700/114; 29/832; 700/28; 700/121

(58) Field of Classification Search ............ 700/114, 700/28, 121; 29/832
See application file for complete search history.

(56) References Cited

U.S. PATENT DOCUMENTS

| | | | | |
|---|---|---|---|---|
| 4,566,071 A | * | 1/1986 | Takahashi | .......... 700/121 |
| 5,020,964 A | * | 6/1991 | Hyatt et al. | .......... 198/375 |
| 5,949,681 A | * | 9/1999 | Asai et al. | .......... 700/113 |
| 6,002,650 A | * | 12/1999 | Kuribayashi et al. | .......... 700/117 |
| 6,260,261 B1 | * | 7/2001 | Marks et al. | .......... 29/740 |
| 6,334,115 B1 | * | 12/2001 | Kuribayashi et al. | .......... 705/27 |
| 6,999,835 B2 | * | 2/2006 | Kodama | .......... 700/121 |
| 7,017,261 B2 | * | 3/2006 | Okamoto et al. | .......... 29/832 |
| 7,281,323 B2 | * | 10/2007 | Hwang | .......... 29/834 |
| 2006/0117560 A1 | * | 6/2006 | Yamasaki et al. | .......... 29/832 |

FOREIGN PATENT DOCUMENTS

| | | |
|---|---|---|
| JP | 8-032294 | 2/1996 |
| JP | 11-068398 | 3/1999 |
| JP | 2000-259250 | 9/2000 |
| JP | 2001-085900 | 3/2001 |

OTHER PUBLICATIONS

Liukkonen et al., "Increasing Placement Capacity with Area Based Optimization and Line Balancing", 2004, Microelectronics International, 6 pages.*

* cited by examiner

*Primary Examiner*—Albert Decady
*Assistant Examiner*—Thomas H Stevens
(74) *Attorney, Agent, or Firm*—Mattingly & Malur, P.C.

(57) ABSTRACT

Technology is provided for changing a mounting angle of a component to reduce the amount of relative displacement between a mounting head and a board. A component, for which a mounting angle can be changed, is specified based on information stored in a mounting data storage area and a component data storage area according to a predetermined component mounting order. A mounting time in a mounting path with the mounting angle of the specified component being changed is calculated for each mounting angle to specify the mounting path requiring the shortest mounting time.

10 Claims, 9 Drawing Sheets

| No. | COMPONENT ID | x | y | θ (BEFORE CHANGE) | θ (AFTER CHANGE) |
|---|---|---|---|---|---|
| 1 | aaa | 100 | 100 | 0° | 180° |
| 4 | aaa | 1000 | 50 | 180° | 0° |
| 5 | bbb | 150 | 250 | 45° | 135° |

US 7,885,723 B2

SETTING DEVICE, COMPONENT MOUNTING SYSTEM, PROGRAM AND CALCULATING METHOD

BACKGROUND OF THE INVENTION

The present invention relates to a technology of mounting a component onto a board.

In a conventional component mounting device for mounting an electronic component onto a circuit board, the component held by a tape feeder of a component feeding device is held by a suction nozzle provided to a mounting head, and is conveyed to a predetermined position on the circuit board for mounting.

In component mounting device such as described above, the mounting head is formed in a disc-like form. The suction nozzle is provided at a position away from a center of the mounting head. Then, the mounting head is rotated about its center through a predetermined angle so that a mounting angle of the component held by the suction nozzle is changed to allow the component to be mounted onto the circuit board.

In component mounting device such as described above, there is known a technology, which is employed in order to reduce mounting time of the electronic components, and in which, when the mounting head is rotated about its center, the mounting head is rotated in a direction that makes a rotation angle between the current mounting angle and a target mounting angle smaller (see Japanese Patent Application Laid-Open No. 8-32294).

In the technology described in Japanese Patent Application Laid-Open No. 8-32294, the mounting angle of the component onto a board is set in advance. Therefore, when the mounting angle of the component is set so that a relative displacement between the mounting head and the board becomes larger, the time required for mounting the components becomes correspondingly longer.

SUMMARY OF THE INVENTION

In view of the above-described problem, an object of the present invention is to provide a technology of changing a mounting angle of a component to reduce the amount of relative displacement between a mounting head and a board.

In order to solve the above problem, the present invention provides a technology of changing a mounting angle of a component, for which the mounting angle can be changed, when placing a plurality of components on a board, to calculate the mounting angle of the component so as to reduce the amount of relative displacement between the mounting head and the board.

A setting device for specifying the mounting angle of the component in a mounting device for conveying the component fed from a feeding device according to a predetermined mounting order of the component and for changing a relative position between a board and the component to mount the component at a predetermined position on the board, comprises: a storage unit for storing mounting position information for specifying the position on the board, at which the component is mounted, for each component, mounting angle information for specifying an angle, at which the component can be mounted onto the board, for each component, polarity information for specifying whether or not the mounting angle can be changed for each component, and calculation information for calculating a mounting time for the components; and a calculation processing unit, wherein the calculation processing unit performs: a mounting path calculating process for specifying the component for which the mounting angle can be changed based on the polarity information, specifying a mountable angle of the component based on the changeable angle amount information of the specified component, and changeable angle amount information which specifies a changeable angle amount based on a design value and calculating a mounting path of each component for each mounting angle specified; a mounting time calculating process for calculating a mounting time for each mounting path calculated in the mounting path calculating process by using the calculation information; and a mounting path specifying process for specifying the mounting path requiring the shortest mounting time of the mounting times calculated in the mounting time calculating process.

As described above, according to the present invention, for mounting a plurality of components onto the board, the combination of mounting angles of the components which allows the amount of relative displacement between the mounting head and the board to be reduced can be calculated. Accordingly, the amount of relative displacement between the mounting head and the board is reduced to allow the component mounting time to be shortened.

BRIEF DESCRIPTION OF THE DRAWINGS

In the accompanying drawings:

FIG. 4 is a top view of a board 160 and a component 163;

FIG. 5 is a schematic view of a component placement data table 132a;

FIG. 6 is a schematic view of a mounting data table 133a;

FIG. 7 is a schematic view of a device data table 134a;

FIG. 8 is a schematic view of a component data table 135a;

DETAILED DESCRIPTION OF THE PREFERRED EMBODIMENTS

Figure 1:
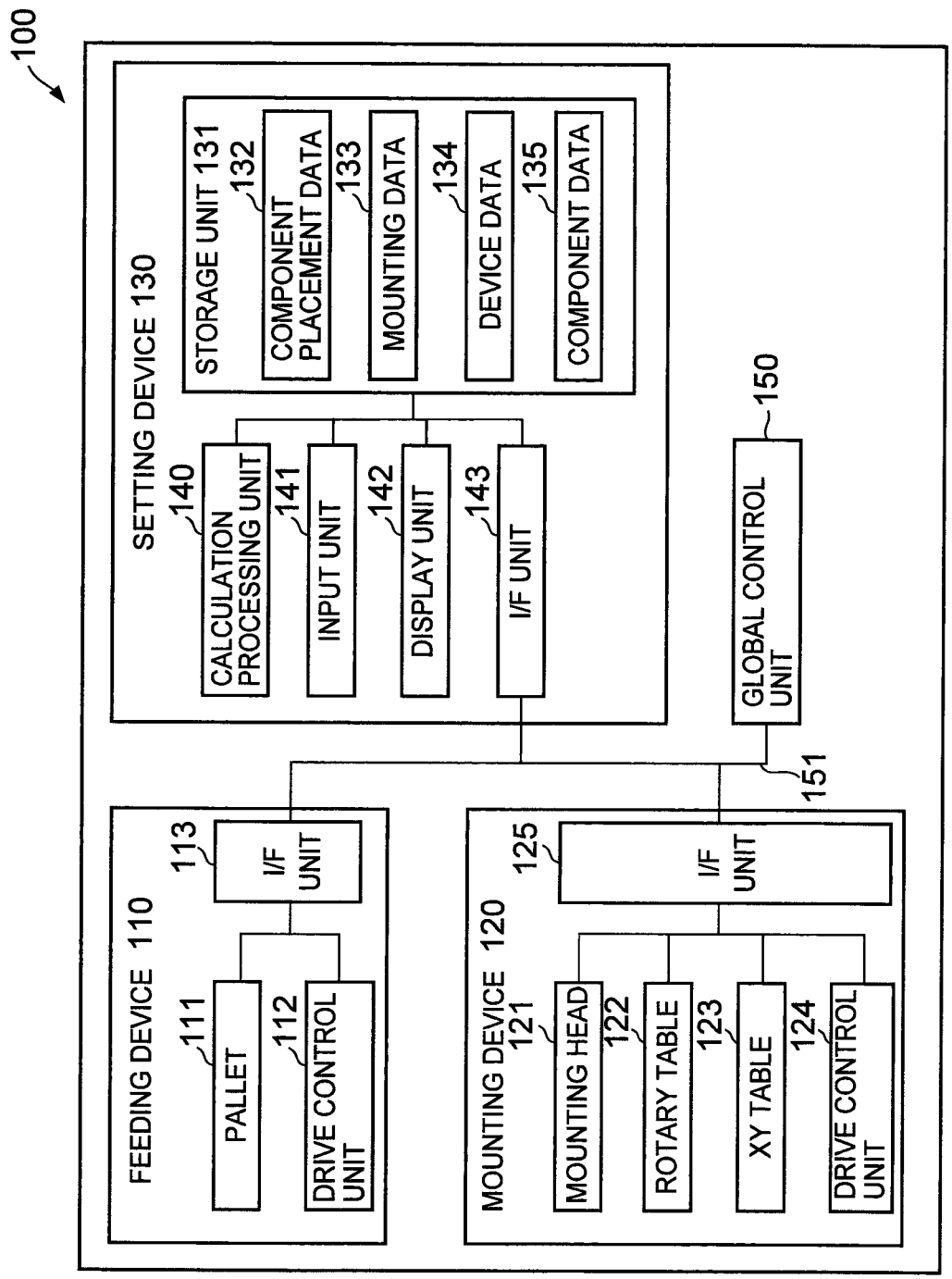
FIG. 1 is a schematic view of a component mounting system 100 embodying a first embodiment of the present invention.

FIG. 1 is a schematic view of a component mounting system 100 embodying a first embodiment of the present invention.

As illustrated, the component mounting system 100 includes a feeding device 110, a mounting device 120, a setting device 130, and a global control unit 150. The devices 110, 120 and 130 and the unit 150 are connected to each other through a bus 151.

The feeding device 110 includes a pallet 111, a drive control unit 112, and an I/F unit 113.

Figure 2:
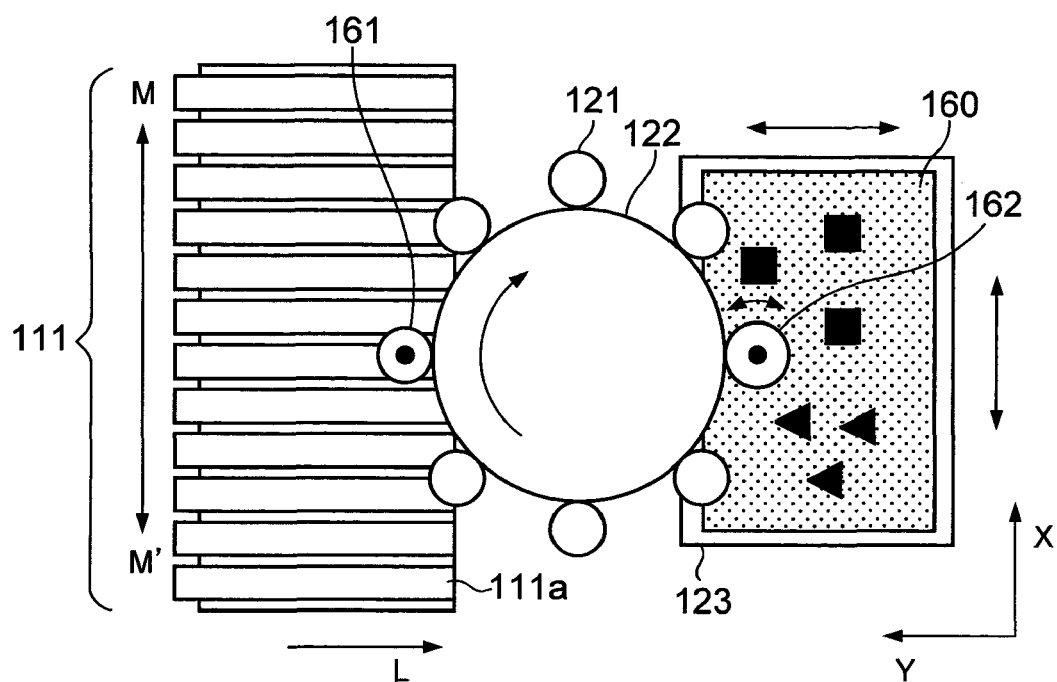
FIG. 2 is a top view of a pallet 111, mounting heads 121, a rotary table 122 and an XY table 123.

As illustrated in FIG. 2 (corresponding to a top view of the pallet 111, mounting heads 121, a rotary table 122 and an XY table 123), the pallet 111 is composed of the arrangement of a plurality of tape feeders 111a. Each of the tape feeders 111a holds a component to be mounted onto a board 160 with a tape and conveys the component to a position at which the component is held by the mounting head 121 described below.

Multiple components of the same type are retained in the same posture on the single tape feeder 111a. By moving the pallet 111 in a direction (in an M- or M'-direction) vertical to a conveying direction (an L-direction) of the tape feeder 111a, the type of component held by the mounting head 121 can be switched.

The drive control unit 112 controls the pallet 111 through the global control unit 150 described below according to the order of feeding of the components, which is set in the setting device 130 described blow. In this manner, a predetermined type of component is fed to the mounting head 121 in a predetermined order.

The I/F unit 113 is an interface for transmitting and receiving information through the bus 151.

The mounting device 120 includes the mounting heads 121, the rotary table 122, the XY table 123, a drive control unit 124, and an I/F unit 125.

The mounting heads 121 are attached to a lateral side of the rotary table 122 formed in a cylindrical shape. By rotating the rotary table 122, the mounting head 121 is moved from a position 161 for holding a component from the pallet 111 to a position 162 for mounting the component onto the board 160.

Then, at the position 161 for holding the component from the pallet 111, the mounting head 121 uses a suction nozzle (not shown), which is provided to the mounting head 121, to hold the component held by the tape feeder 111a. The mounting head 121 stops the suction by the suction nozzle at the position 162 for mounting the component onto the board 160 to allow the component to be mounted onto the board 160.

Figure 3:
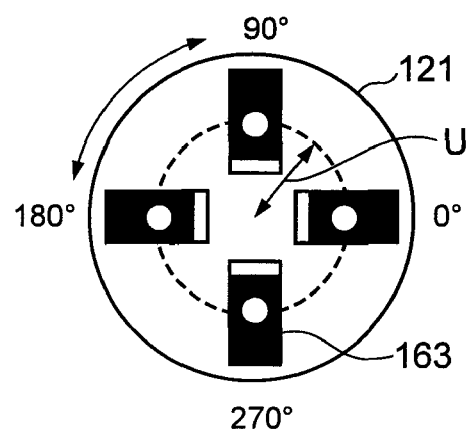
FIG. 3 is a bottom view of the mounting head 121.

As illustrated in FIG. 3 (bottom view of the mounting head 121), the mounting head 121 is formed in a cylindrical shape. The suction nozzle is formed at a predetermined distance U away from the center of the mounting head 121. With the suction nozzle formed at such a position, an angle (posture) of the component with respect to the board can be changed by rotating the mounting head 121 about its center. For example, FIG. 3 shows an example where an angle of a component 163 is changed to 0°, 90°, 180°, and 270°.

The rotary table 122 is formed in a cylindrical shape as described above. By rotating the rotary table 122 about its center, the mounting head 121 attached onto the lateral side of the rotary table 122 can be moved from the position 161 for holding the component from the pallet 111, to the position 162 for mounting the component onto the board 160.

As illustrated in FIG. 2, the XY table 123 moves the board 160 placed thereon in an X-direction and a Y-direction to align the position 162 for mounting the component held by the suction nozzle of the mounting head 121 with a position on the board 160 at which the component is mounted.

A travel distance of the XY table 123 in a case where a component is placed at a specific angle will now be described with reference to FIG. 4 (top view of the board 160 and the component 163).

For example, it is assumed that the component 163 to be placed on the board 160 is a non-polar component and therefore can be mounted at any of 0° and 180° with respect to the board 160. It is also assumed that the center of the mounting head 121 for mounting the component previous to the component 163 is at a position 164. In such a case, when the component 163 is placed at 0°, the center of the mounting head 121 is at a position 165. On the other hand, when the component 163 is placed at 180°, the center of the mounting head 121 is at a position 166. When the XY table 123 is moved to those positions, the XY table 123 is required to be moved by an amount of diameter of revolution (2U: see FIG. 3) of the suction nozzle, in the case of the mounting of the component 163 at 180°, farther than in the case of the mounting at 0°. The present invention intends to eliminate this type of extra travel distance, so as to reduce mounting time.

The drive control unit 124 controls the mounting heads 121, the rotary table 122, and the XY table 123 through the global control unit 150 described below according to mounting order, mounting angle and the mounting position of a component, which are set by the setting device 130 described below.

The I/F unit 125 is an interface for transmitting and receiving information through the bus 151.

The setting device 130 includes a storage unit 131, a calculation processing unit 140, an input unit 141, a display unit 142, and an I/F unit 143.

The storage unit 131 includes a component placement data storage area 132, a mounting data recording area 133, a device data storage area 134, and a component data storage area 135.

The component placement data storage area 132 stores information for specifying a component feeding position in the feeding device 110 and information for specifying a component fed at the feeding position.

Figures 4, 5:
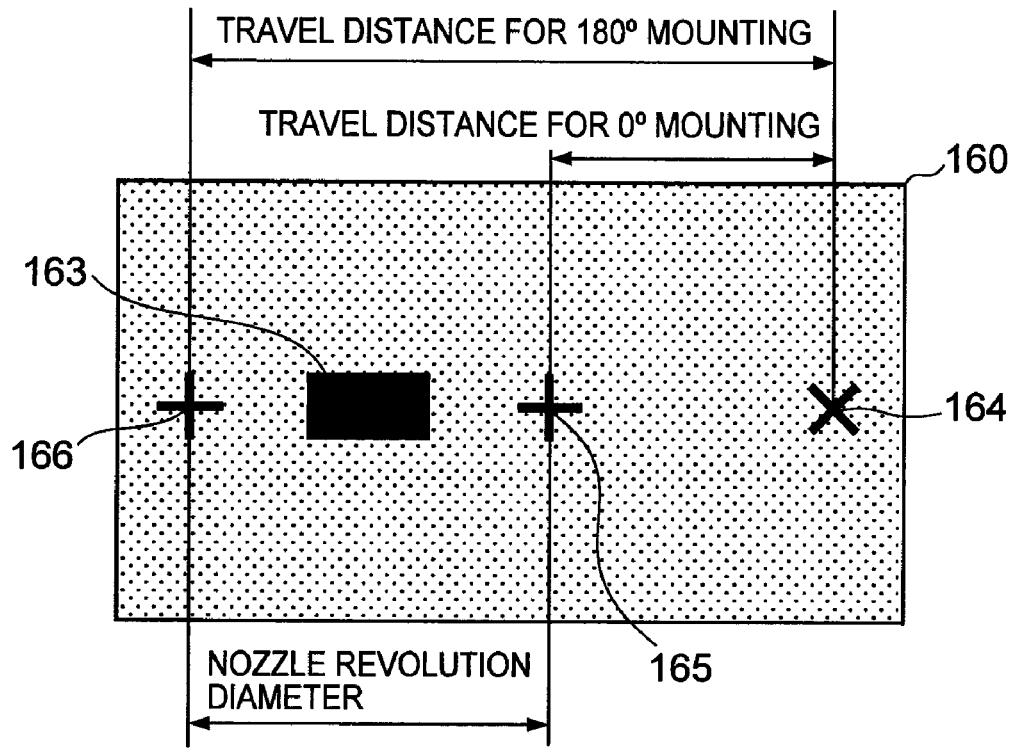

For example, in this embodiment, a component placement data table 132a as illustrated in FIG. 5 is stored in the component placement data storage area 132.

As illustrated in FIG. 5, the component placement data table 132a contains a loading position number field 132b and a component type number field 132c.

The loading position number field 132b stores information for specifying the position of the tape feeder 111a which holds a component of the type specified by the component type number field 132c described below. In this embodiment, a loading position number indicating a loading position of the tape feeder 111a is used as the information for specifying the position of the tape feeder 111a. As the loading position number, a position number determined in ascending order from the reference position on the pallet 111 (for example, the position of one end of the pallet 111) is used.

The component type number field 132c stores information for specifying the type of component. In this embodiment, a component type number predetermined for each type of component is stored as the information for specifying the type of component.

The mounting data recording area 133 stores information for specifying a position on the board at which the component is mounted, information for specifying the feeding position of the component in the feeding device 110, information for specifying an angle at which the component is mounted onto the board, and information for specifying whether or not the mounting angle of the component can be changed.

Figure 6:
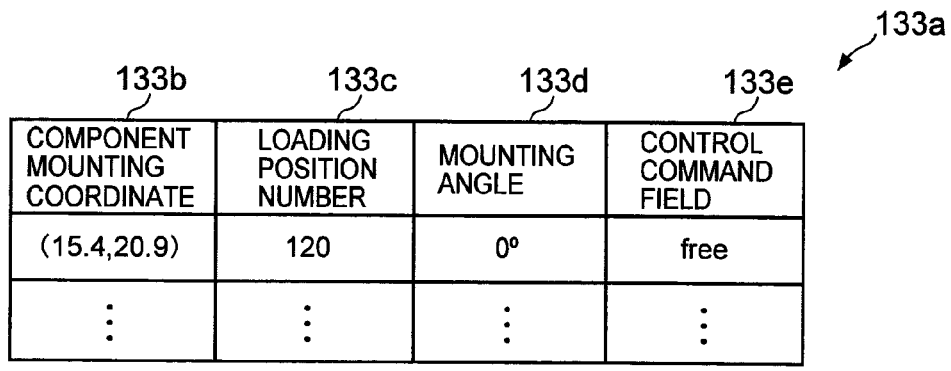

For example, in this embodiment, a mounting data table 133a as illustrated in FIG. 6 is stored.

As illustrated, the mounting data table 133a contains a component mounting coordinate field 133b, a loading position number field 133c, a mounting angle field 133d, and a control command field 133e.

The component mounting coordinate field 133b stores information for specifying the position on the board placed on the XY table, at which the component of the type specified by the mounting position number field 133c is mounted. In this embodiment, mounting coordinates for specifying such a position on the XY table 123 are stored in the component mounting coordinate field 133b.

The loading position number field 133c stores information for specifying a feeding position of the component mounted at the coordinates specified by the component mounting coordinate field 133b. In this embodiment, as described above, a loading position number for specifying the position of the tape feeder 111a is stored.

The mounting angle field 133d stores information for specifying an angle of the component to be mounted onto the board. In this embodiment, an arbitrary angle ranging from 0° to 360° is stored for this type of angle.

In this embodiment, the mounting angle is specified in the following manner. The component, that is in a position in which it is held by the tape feeder 111a, is held by the suction nozzle. The rotary table 122 is rotated to the mounting position on the board without rotating the mounting head 121. The mounting angle of the component in this case is determined as 0°. However, the mounting angle is not limited thereto.

The mounting angle field 133d stores a mounting angle in designing the board.

The control command field 133e stores information for specifying whether or not the angle specified by the mounting angle field 133d can be changed. In this embodiment, when the angle can be changed, the string "Free" is stored in the control command field 133e. On the other hand, when the angle cannot be changed, the string "Fix" is stored.

The device data storage area 134 stores information concerning the mounting device 120.

Figure 7:
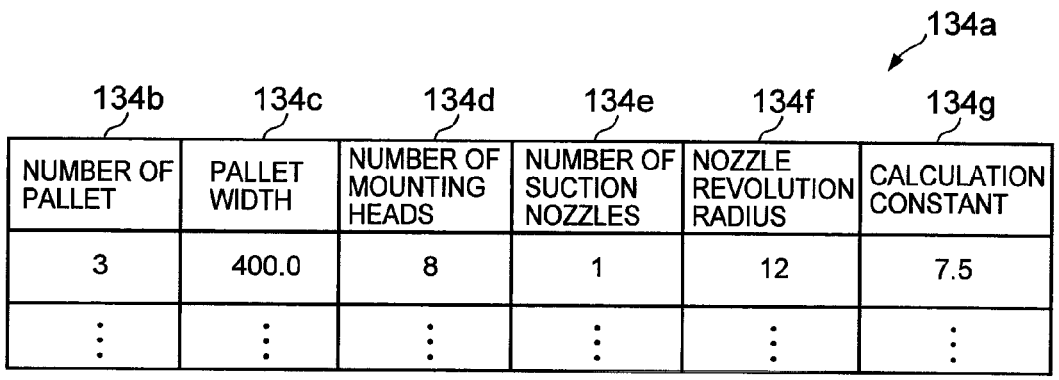

For example, in this embodiment, a device data table 134a as illustrated in FIG. 7 is stored.

As illustrated, the device data table 134a contains a pallet number field 134b, a pallet width field 134c, a mounting head number field 134d, a suction nozzle number field 134e, a nozzle revolution radius field 134f, and a calculation constant field 134g.

The pallet number field 134b stores information for specifying the number of pallets 111 used in the feeding device 110.

The pallet width field 134c stores information for specifying a width of the pallet 111 used in the feeding device 110.

The mounting head number field 134d stores information for specifying the number of the mounting heads 121 attached to the single rotary table 122.

The suction nozzle number field 134e stores information for specifying the number of suction nozzles formed on the single mounting head 121.

The nozzle revolution radius field 134f stores information for specifying a radius of revolution U when a suction nozzle formed on the mounting head 121 is rotated (see FIG. 3).

The calculation constant field 134g stores information required for calculating mounting time required for mounting components. For example, information for specifying operation speed, operation acceleration, and the like, of an actuator (such as the pallet 111, the mounting head 121, the rotary table 122, and the XY table 123) necessary to calculate a required operation time for each unit of the device, is stored. In this embodiment, traveling speed of the XY table 123, traveling speed of the pallet 111, and rotational angular velocity of the rotary table 122 are stored.

The component data storage area 135 stores information for specifying the type of component, identification information for uniquely identifying each component, information for specifying the size of each component, information for specifying whether or not a mounting angle of each component can be changed, and information for specifying a mountable angle of each component.

Figure 8:
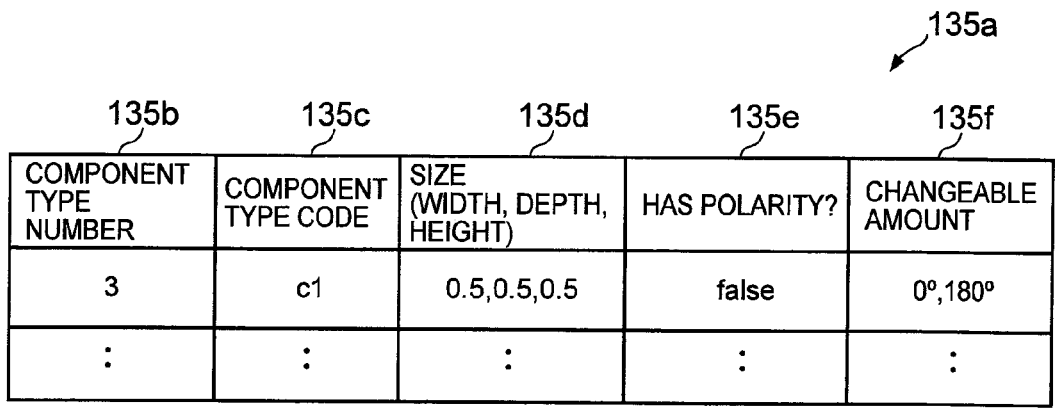

For example, in this embodiment, a component data table 135a as illustrated in FIG. 8 is stored in the component data storage area 135.

As illustrated, the component data table 135a contains a component type number field 135b, a component type code field 135c, a size field 135d, a polarity field 135e, and a changeable amount field 135f.

The component type number field 135b stores information for specifying the type of component specified by the component type code field 135c described below. In this embodiment, a component type number predetermined for each type of component is stored in the component type number field 135b.

The component type code field 135c stores identification information for uniquely identifying each of the components mounted onto the board. In this embodiment, a code number for uniquely identifying each of the components is stored in the component type code field 135c.

The size field 135d stores information for specifying the size of the component specified by the component type code field 135c. In this embodiment, width, depth and height of the component are specified.

The polarity field 135e stores information for specifying whether or not a mounting angle of the component specified by the component type code field 135c can be changed. In this embodiment, when the mounting angle cannot be changed, the component is determined as having polarity. Therefore, the string "true" is stored in the polarity field 135e. On the other hand, when the mounting angle can be changed, the component is determined as not having polarity. Therefore, the string "false" is stored in the polarity field 135e.

The changeable amount field 135f stores information for specifying the angle amount which can be changed from a design value when the component is determined as a non-polar one (a component for which the mounting angle can be changed) based on the string stored in the polarity field 135e.

In this embodiment, the angle amount is specified with the clockwise direction, when viewed from the upper surface of the board, as a positive direction.

The calculation processing unit 140 first accepts input of initial information through the input unit 141 described below. The initial information includes information for specifying coordinates of a position of a starting point (hereinafter, referred to as starting point position coordinates), information for specifying coordinates of a position of an end point (hereinafter, referred to as end point position coordinates), and information for specifying the mounting order of the components.

As the starting point position coordinates, arbitrary coordinates on the XY table 123 can be input. For example, when the XY table 123 always starts operating at a predetermined starting position in terms of design of the mounting device 120, coordinates of the position opposed to the suction nozzle of the mounting head 121 at the starting position may be input. Alternatively, for example, when the mounting of the component is started after an identification mark of the board placed on the XY table 123 is read in terms of design of the mounting device 120, coordinates of the position opposed to the suction nozzle of the mounting head 121 for reading the identification mark may be input.

Similarly, as the end point position coordinates, arbitrary coordinates on the XY table 123 may be input. For example, when the XY table 123 is made to return to a predetermined position after the end of mounting of the components on each board, coordinates of the position opposed to the suction nozzle of the mounting head 121 at the end of mounting may be input.

The calculation processing unit 140 calculates a mounting time in a mounting path from the starting point position coordinates input through the input unit 141 through the mounting positions in accordance with the mounting order of the components to the end point position coordinates. The mounting time is calculated for each of all the combinations of mounting angles while the mounting angle of the component is varied, thereby specifying the mounting path requiring the shortest mounting time.

The mounting angle of the component is changed when it is determined that the mounting angle of the component can be changed based on the control command field 133e in the mounting data table 133a and the polarity field 135e in the component data table 135a.

When the mounting angle cannot be changed for a reason relating to the board, the string indicating that the mounting angle cannot be changed is stored in the mounting data table 133a. On the other hand, when the mounting angle cannot be changed for a reason relating to the component, the string indicating that the mounting angle cannot be changed is stored in the component data table 135a. In this manner, in view of the reasons relating to both board and component, it can be determined whether or not the mounting angle can be changed.

For the travel distance of the XY table 123 for each mounting angle of the component, the position of the suction nozzle of the mounting head 121 for mounting the component at each of the angles stored in the changeable amount field 135f in the component data table 135a, and a distance, for which the XY table must be moved to align the position of the suction nozzle with the coordinates stored in the component mounting coordinate field 133b, are calculated according to the mounting order of the components.

The mounting time for each mounting path is calculated by using the information stored in the calculation constant field 134g in the mounting data table 134a based on the travel distances of the pallet 111, the mounting head 121, the rotary table 122 and the XY table 123 in the mounting order of the components.

Regarding a method of calculating the mounting time, the mounting time may be appropriately calculated for each device. In this embodiment, for example, a component mounting time is calculated by the following formula.

Component mounting time=Sum of max(traveling time of the *XY* table 123, traveling time of the pallet 111, and rotation time of the rotary table 122)

In the above formula, traveling time of the XY table 123=travel distance of the XY table 123/traveling speed of the XY table 123, traveling time of the pallet 111=travel distance of the pallet 111/traveling speed of the pallet 111, and rotation time of the rotary table 122=rotation angle of the rotary table 122/rotational angular velocity of the rotary table 122.

Figure 9:
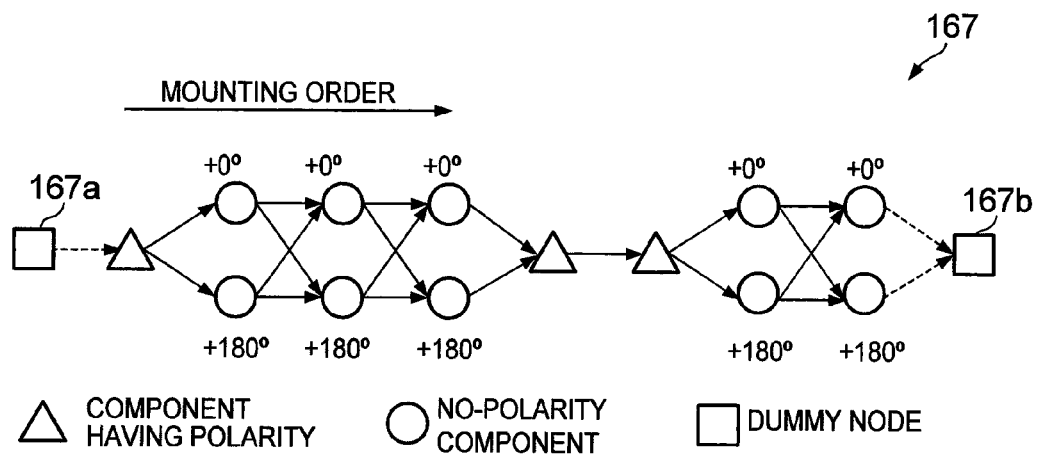
FIG. 9 is a schematic view of a directed graph 167.

The calculation of the mounting time by the calculation processing unit 140 is equivalent to the calculation for obtaining the shortest path in a directed graph 167, for example, as shown in FIG. 9.

The directed graph 167 includes dummy nodes 167a and 167b arranged at both ends and the other nodes arranged therebetween. The dummy node 167a represents the starting point position coordinates, and the dummy node 167b represents the end point position coordinates. The nodes provided between the dummy nodes 167a and 167b represent components to be mounted onto the board and are arranged in the mounting order. In the case where the mounting angle of the component can be changed, the nodes representing the same component are vertically arranged for the respective changeable angle amounts.

In FIG. 9, the component, for which the mounting angle can be changed, is represented as a non-polar component by a small circle, whereas the component, for which the mounting angle cannot be changed, is represented as a polar component by a small triangle. For a directed arc for connecting the nodes, a difference between the time at which the component represented by a start node of the arc is mounted, and the time at which the component represented by an end node of the arc is mounted, corresponds to a distance between the nodes.

The difference between the time at which the component represented by the start node of the arc is mounted and the time at which the component represented by the end node of the arc is mounted is defined by the following formula.

Inter-node distance=max(traveling time of the *XY* table 123, traveling time of the pallet 111, rotation time of the rotary table 122)

Figure 10:
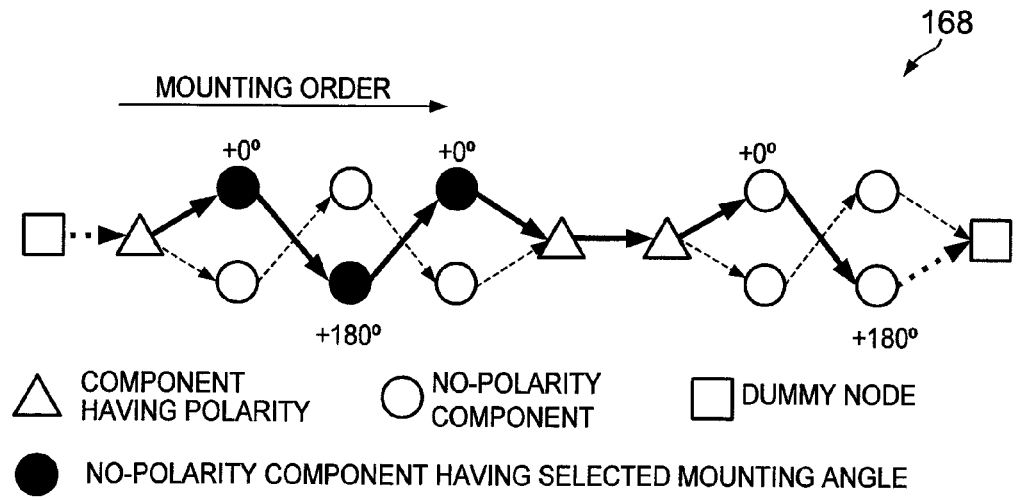
FIG. 10 is a schematic view of a directed graph 168.

Referring to FIG. 10, the shortest path in the directed graph 167 defined by the above formula, which indicates the optimal component-mounting angles assuming that the mounting order of the components is given, will be described.

In FIG. 10, a thick-line arrow represents the shortest path in the directed graph 167. A black circle represents a node through which the shortest path passes.

The shortest path corresponds to a path which achieves the smallest sum of the lengths of the directed arcs, specifically, a path which makes the component mounting time the shortest. It is understood that the shortest component mounting time can be achieved by changing the mounting angle of each of the components according to the mounting angle change amounts represented by the black circle nodes.

As described above, the shortest path in the directed graph 167 can be obtained by checking all the combinations. However, the shortest path can be more efficiently obtained by using the Ford method.

Figures 11, 12:
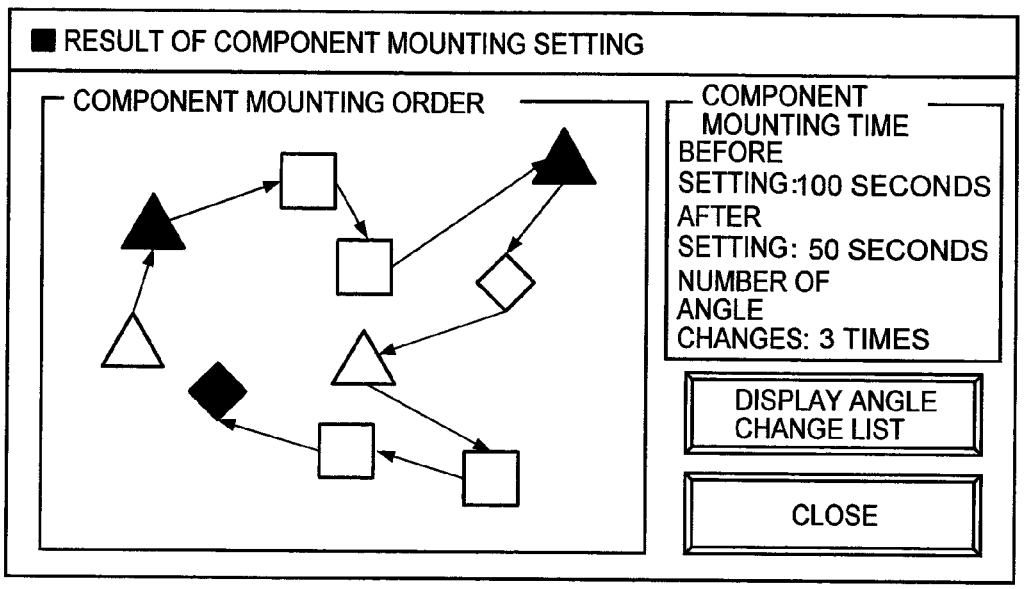
FIG. 11 is a schematic view of a display screen 169.
FIG. 12 is a schematic view of a change list screen 170.

The calculation processing unit 140 can display the mounting path specified as described above on, for example, a display screen 169 as illustrated in FIG. 11.

In FIG. 11, in order to specify the mounting order, the mounting position, and the mounting angle of each of the components, the display screen 169 displays the mounting order with arrows and the component mounting positions with symbols representing the respective components so as to specify the mounting angle for each symbol.

The calculation processing unit 140 can also aggregate only the mounting angles of the components positioned in the specified mounting path, which are different from those stored in the mounting angle field 133d in the mounting data table 133a, to display, for example, a change list screen 170 shown in FIG. 12 on the display unit 142.

The change list screen 170 has a number field 170a indicating the mounting order of the component in ascending order, a component type code field 170b specifying identification information of the component mounted in the order specified in the number field 170a, an X field 170c specifying a point on one coordinate axis, at which the component is mounted, a Y field 170d specifying a point on the other coordinate axis, at which the component is mounted, a θ (before change) field 170e specifying an angle stored in the mounting angle field 133d in the mounting data table 133a, and a θ (after change) field 170f specifying an angle after change.

The calculation processing unit 140 creates setting information obtained by gathering information such as the component mounting order, the mounting angle, the mounting position, and the loading position for carrying out the thus calculated mounting path. Then, the calculation processing unit 140 outputs the setting information to the global control unit 150 described below through the I/F unit 143 described below.

The input unit 141 is an input device for inputting information. For example, the input unit 141 can be constituted by a mouse, a keyboard, or the like.

The display unit 142 is a display device for displaying information. For example, the display unit 142 can be constituted by a display, or the like.

The I/F unit 143 is an interface for transmitting and receiving information through the bus 151.

The setting device 130 described above can be realized by what is referred to as a computer. For example, the storage unit 131 can be realized by an auxiliary storage device such as a hard disk, whereas the calculation processing unit 140 can be realized by executing a program stored in a storage device such as a hard disk, by a central processing unit (CPU).

The global control unit 150 controls processing executed in the feeding device 110, the mounting device 120, and the setting device 130. In particular, as described above, the global control unit 150 controls the feeding device 110 and the mounting device 120 based on the setting information created in the setting device 130.

The feeding device 110, the mounting device 120, the setting device 130 and the global control unit 150 are connected to each other through the bus 151.

Figure 13:
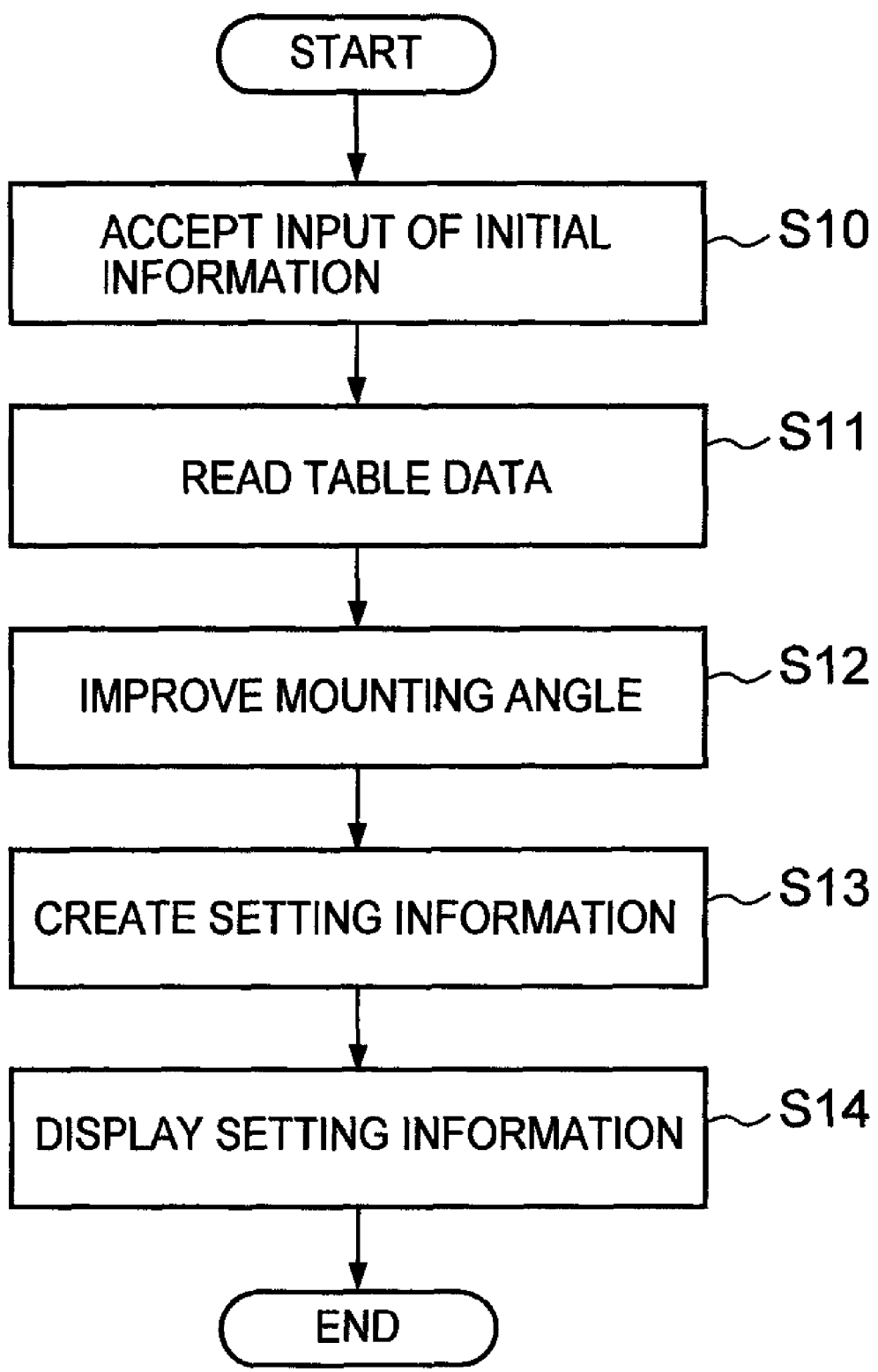
FIG. 13 is a flowchart of a setting information creating process in a setting device 130.

A process of creating the setting information in the thus configured setting device 130 will be described, referring to a flowchart shown in FIG. 13.

First, the calculation processing unit 140 of the setting device 130 accepts input of initial information through the input unit 148 (S10).

The initial information, which is input through the input unit 148 in this step, includes information for specifying the starting point position coordinates, information for specifying the end point position coordinates, and information for specifying the mounting order of the components.

Next, the calculation processing unit 140 reads the component placement data table 132*a*, the mounting data table 133*a*, the device data table 134*a*, and the component data table 135*a* which are stored in the storage unit 131 (S11).

Then, the calculation processing unit 140 calculates a mounting time in the input mounting order at each of the angles based on the initial information input in Step S10 and the tables read in Step S11 to specify the mounting angle requiring the shortest mounting time, thereby improving the mounting angle of the component (S12).

Next, the calculation processing unit 140 creates the setting information with the improved mounting angle (S13), and then displays the created setting information through the display unit 142 (S14).

The calculation processing unit 140 can accept a correction for the setting information displayed on the display unit 142 through the input unit 141. When such a correction is accepted, the calculation processing unit 140 creates corrected setting information.

Figure 14:
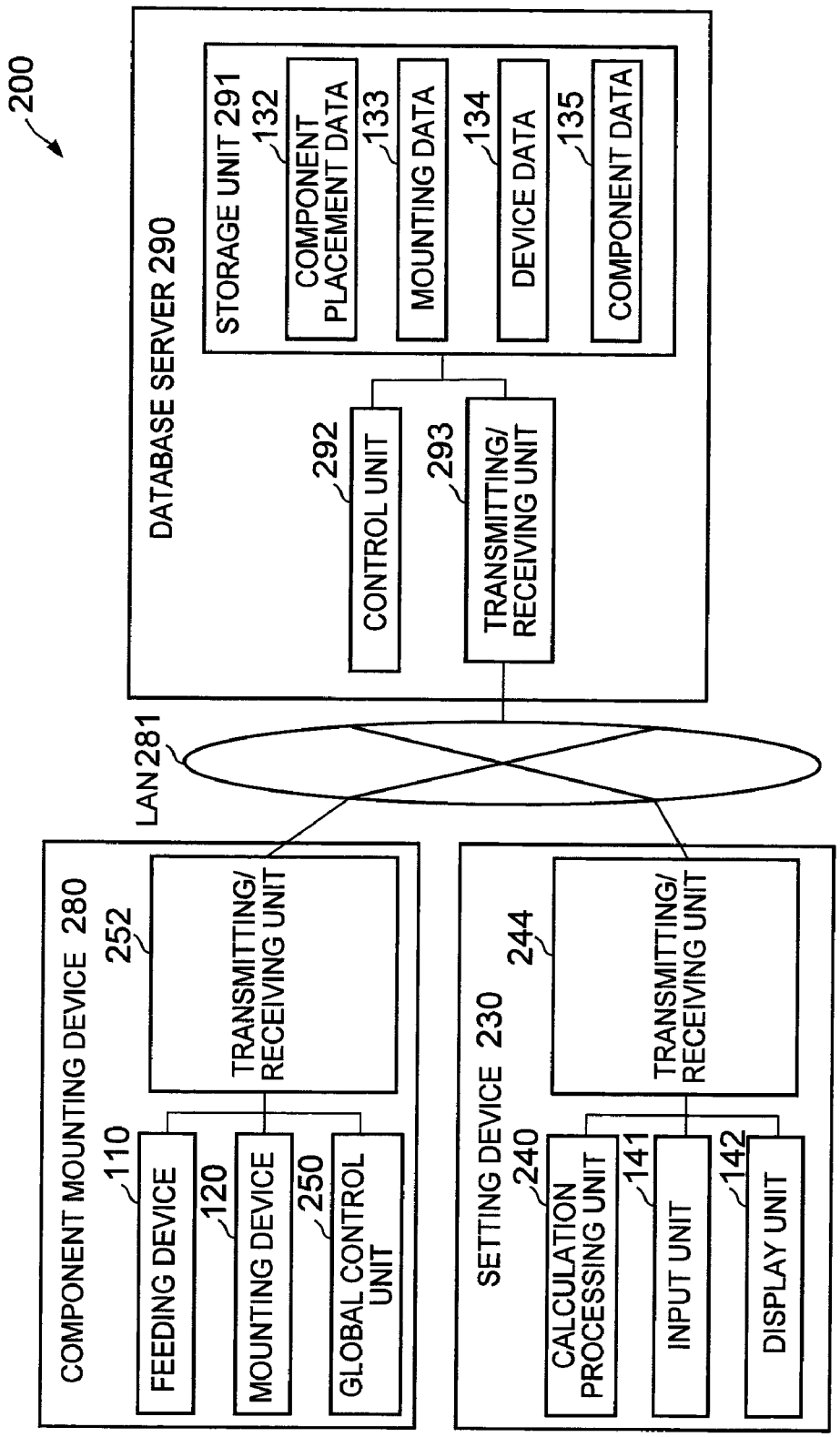
FIG. 14 is a schematic view of a component mounting system 200 embodying a second embodiment of the present invention.

FIG. 14 is a schematic view of a component mounting system 200 embodying a second embodiment of the present invention.

As illustrated, the component mounting system 200 includes a component mounting device 280, a setting device 230, and a database server 290. The component mounting device 280, the setting device 230, and the database server 290 are connected to each other through a LAN 281.

As illustrated, the component mounting device 280 includes the feeding device 110, the mounting device 120, a global control unit 250, and a transmitting/receiving unit 252.

The feeding device 110 and the mounting device 120 of FIG. 14 are the same as those of the first embodiment, so the description thereof is herein omitted.

The global control unit 250 in this embodiment receives the setting information from the setting device 230 through the transmitting/receiving unit 252 described below to control the feeding device 110 and the mounting device 120 based on the received setting information.

The transmitting/receiving device 252 is an interface for transmitting and receiving information through the LAN 281. For example, a network interface card (NIC) may be used as the transmitting/receiving device 252.

The setting device 230 includes a calculation processing unit 240, the input unit 141, the display unit 142, and a transmitting/receiving unit 244. The setting device 230 differs from the setting device 130 of the first embodiment in that the storage unit 130 is omitted and the transmitting/receiving unit 244 is provided.

In the second embodiment, the calculation processing unit 240 reads the component placement data table 132*a*, the mounting data table 133*a*, the device data table 134*a*, and the component data table 135*a* stored in the storage unit 131 to determine the mounting angle of the component. In this second embodiment, the calculation processing unit 240 reads the tables from the database server 290 described below.

The transmitting/receiving unit 244 is an interface for transmitting and receiving information through the LAN 281. For example, the NIC may be used as the transmitting/receiving unit 244.

The database server 290 includes a storage unit 291, a control unit 292, and a transmitting/receiving unit 293.

As in the first embodiment, the storage unit 291 includes the component placement data storage area 132, the mounting data recording area 133, the device data storage area 134, and the component data storage area 135. The storage unit 291 stores the same data as that stored in the storage unit 131 of the first embodiment.

The control unit 292 controls processing of the whole database server 290.

The transmitting/receiving unit 293 is an interface for transmitting and receiving information through the LAN 281. For example, the NIC may be used as the transmitting/receiving unit 293.

In the second embodiment described above, the setting information is transmitted from the setting device 230 to the component mounting device 280 through the LAN 281. The transmission/reception of the setting information is not limited thereto. For example, the setting information may be transmitted and received through a storage medium.

Figure 15:
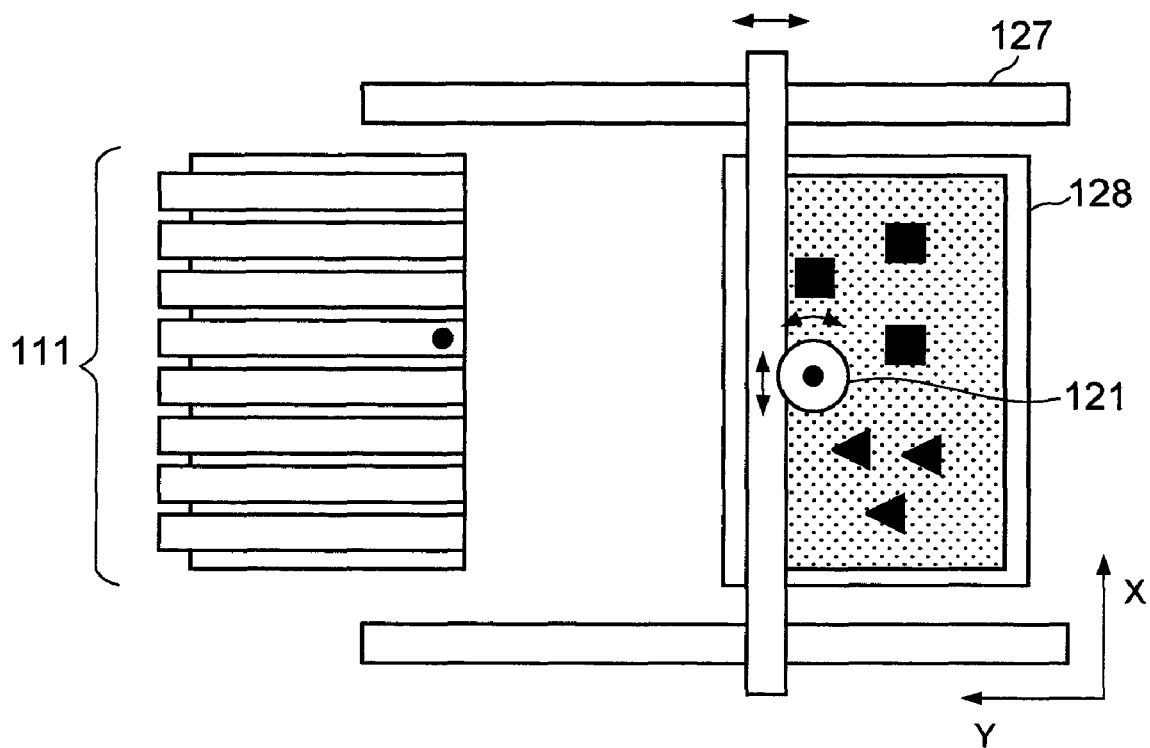
FIG. 15 is a top view of the pallet 111, the mounting head 121, a table 128, and an XY robot 127.

In the embodiments described above, a turret-type device including the mounting heads 121, the rotary table 122, and the XY table 123 as shown in FIG. 2 has been described as the mounting device. However, for example, a gantry-type device including the mounting head 121, an XY robot 127 for moving the mounting head 121 in an X-direction and a Y-direction, and a table 128 as illustrated in FIG. 15 (top view of the pallet 111, the mounting head 121, the table 128, and the XY robot 127) can also be used as the mounting device 120.

In such a case, an operation speed of the XY robot 127 is required to be additionally stored in the calculation constant field 134*g*.

In the above-described embodiments, the mounting order of the components is input through the input unit 141. However, the input of the mounting order of the components is not limited thereto. For example, the mounting order of the components may be calculated for all the components in the calculation processing unit 140. Among them, the mounting order and the mounting angle which achieve the shortest relative travel distance between the mounting head 121 and the board may be calculated.

Further, the calculation processing unit 140 may appropriately change the mounting order of the components through creation of an initial solution by the nearest insertion method and solution improvement by local search to calculate the mounting angle achieving the shortest travel distance in the changed mounting order.

When the mounting order of the components is appropriately changed, it is possible to avoid requiring a large amount of time for calculating the setting information, by providing an upper limit for the number of changes of the mounting order or for a calculation time.

What is claimed is:

1. A setting device for specifying a mounting angle when mounting a component by a mounting device which conveys the component fed from a feeding device according to a predetermined component mounting order, and, by changing a relative position of a board and the component, mounts the component at a predetermined position on the board, the setting device comprising:
    a storage unit which stores component mounting coordinate information specifying, for each component, a position at which the component is mounted on the board, control command information which specifies whether or not a mounting angle in board design can be changed, mounting angle information which specifies an angle at which the component can be mounted onto the board, for each component, polarity information which specifies whether or not each component has polarity, and calculation constant information which specifies an operation characteristic of each actuator required for calculating component mounting time; and
    a calculation processing unit,
    wherein the calculation processing unit performs according to the predetermined component mounting order:
    a mounting path calculating process for specifying the component for which the mounting angle can be changed based on the polarity information and the control command information, specifying a mountable angle of the component based on the mounting angle information of the specified component, and calculating a mounting path with the mounting angle of each component being specified for each specified mountable angle;
    a mounting time calculating process for calculating a mounting time for each mounting path calculated in the mounting path calculating process by integrating an operation time of an actuator with a maximum operation time, using the calculation constant information;
    a mounting path specifying process which specifies the mounting path requiring a shortest mounting time from the mounting time of each mounting path calculated in the mounting time calculating process; and
    a setting information outputting process which creates setting information including the predetermined component mounting order, the mounting angle, the mounting position, and a loading position of the component on the feeding device for carrying out the specified mounting path on the mounting device.

2. The setting device according to claim 1, wherein the feeding device includes a pallet which feeds the component; the mounting device includes a mounting head which holds and releases the component, a rotary table which moves the mounting head, and an XY table, on which the board is placed, which changes a position of the board; and the calculation constant information further specifies operation timing and operation speed of the pallet, the mounting head, the rotary table, and the XY table.

3. The setting device according to claim 1, wherein the feeding device includes a pallet which feeds the component; the mounting device includes a mounting head which holds and releases the component, and an XY robot which moves the mounting head; and
    the calculation constant information further specifies operation timing and operation speed of the pallet, the mounting head, and the XY robot.

4. The setting device according to claim 1, wherein the calculation processing unit performs a display process for displaying, on a display unit, information specifying the predetermined component mounting order, the component to be mounted, and the mounting angle, for the mounting path specified by the mounting path specifying process.

5. A component mounting system, comprising the setting device, the feeding device, and the mounting device, according to claim 1.

6. A computer readable storage medium that stores a program causing a computer to execute processing specifying a mounting angle when mounting a component by a mounting device which conveys the component fed by a feeding device according to a predetermined component mounting order, and by changing a relative position of a board and the component, mounts the component at a predetermined position on the board, the program causing the computer to function as:
    a storage unit which stores component mounting coordinate information specifying, for each component, a position at which the component is mounted on the board, control command information which specifies whether or not a mounting angle in board design can be changed, mounting angle information which specifies an angle at which the component can be mounted onto the board, for each component, polarity information which specifies whether or not each component has polarity, and calculation constant information which specifies an operation characteristic of each actuator required for calculating component mounting time; and
    a calculation processing unit which performs according to the predetermined component mounting order;
    a mounting path calculating process for specifying the component for which the mounting angle can be changed, based on the polarity information and the control command information, specifying a mountable angle of the component based on the mounting angle information of the specified component, and calculating a mounting path with the mounting angle of each of the components being specified for each specified mountable angle;
    a mounting time calculating process for calculating a mounting time for each of the mounting paths calculated in the mounting path calculating process by integrating an operation time of an actuator with a maximum operation time, using the calculation constant information;
    a mounting path specifying process which specifies the mounting path requiring a shortest mounting time from the mounting time of each mounting path calculated in the mounting time calculating process; and
    a setting information outputting process which creates setting information including the predetermined component mounting order, the mounting angle, the mounting position, and a loading position of the component on the feeding device for carrying out the specified mounting path on the mounting device.

7. The computer readable storage medium storing a program according to claim 6, wherein the feeding device includes a pallet which feeds the component;

the mounting device includes a mounting head which holds and releases the component, a rotary table which moves the mounting head, and an XY table, on which the board is placed, which changes a position of the board; and the calculation constant information further specifies operation timing and an operation speed of the pallet, the mounting head, the rotary table, and the XY table.

8. The computer readable storage medium storing a program according to claim 6, wherein the feeding device includes a pallet which feeds the component;

the mounting device includes a mounting head which holds and releases the component, and an XY robot which moves the mounting head; and the calculation constant information further specifies operation timing and an operation speed of the pallet, the mounting head, and the XY robot.

9. The computer readable storage medium storing a program according to claim 6, wherein the calculation processing unit performs a display process for displaying, on a display unit, information specifying the predetermined component mounting order, the component to be mounted, and the mounting angle, for the mounting path specified by the mounting path specifying process.

10. A calculating method of specifying a mounting angle when mounting a component by a mounting device which conveys the component fed by a feeding device according to a predetermined component mounting order, and, by changing a relative position of a board and the component, mounts the component at a predetermined position on the board, in a setting device comprising a storage unit which stores component mounting coordinate information specifying, for each component, a position at which the component is mounted on the board, control command information which specifies whether or not a mounting angle in board design can be changed, mounting angle information which specifies an angle at which the component can be mounted onto the board, for each component, polarity information which specifies whether or not each component has polarity, and calculation constant information which specifies an operation characteristic of each actuator required for calculating component mounting time, and a calculation processing unit;

the calculating method according to the predetermined component mounting order comprising:

a mounting path calculating step of causing the calculation processing unit to specify the component for which the mounting angle can be changed based on the polarity information and the control command information, to specify a mountable angle of the component based on the mounting angle information of the component specified by the calculation processing unit, and to calculate a mounting path with the mounting angle of each of the components being specified for each specified mountable angle;

a mounting time calculating step of causing the calculation processing unit to calculate a mounting time for each of the mounting paths calculated in the mounting path calculating step by using the mounting path calculation information;

a mounting path specifying step of specifying a mounting path requiring a shortest mounting time from the mounting time of each mounting path calculated in the mounting time calculating step; and a setting information outputting step which creates setting information including the predetermined component mounting order, the mounting angle, the mounting position, and a loading position of the component on the feeding device for carrying out the specified mounting path on the mounting device.

* * * * *